United States Patent [19]
Nakamura et al.

[11] Patent Number: 5,508,534
[45] Date of Patent: Apr. 16, 1996

[54] TRENCH GATE TYPE INSULATED GATE BIPOLAR TRANSISTOR

[75] Inventors: Katsumi Nakamura; Tadaharu Minato, both of Itami; Shuuichi Tominga, Fukuoka; Katsuomi Shiozawa, Amagasaki, all of Japan

[73] Assignee: Mitsubishi Denki Kabushiki Kaisha, Tokyo, Japan

[21] Appl. No.: 384,734

[22] Filed: Feb. 7, 1995

[30] Foreign Application Priority Data

Feb. 24, 1994 [JP] Japan .................... 6-026874

[51] Int. Cl.$^6$ .................... H01L 27/02; H01L 29/78
[52] U.S. Cl. .................... 257/135; 257/331; 257/341; 257/637
[58] Field of Search .................... 257/133, 135, 257/139, 153, 329, 330, 331, 341, 622, 637

[56] References Cited

U.S. PATENT DOCUMENTS 4,767,722  8/1988  Blanchard .
4,893,165  1/1990  Miller et al. .
5,034,785  7/1991  Blanchard .

FOREIGN PATENT DOCUMENTS 2-3980  1/1990  Japan .................... 257/330

*Primary Examiner*—Rolf Hille
*Assistant Examiner*—Minhloan Tran
*Attorney, Agent, or Firm*—Oblon, Spivak, McClelland, Maier & Neustadt

[57] ABSTRACT

A semiconductor device including a layer formed without being affected by a stepped ground pattern and a method of fabricating the semiconductor device are disclosed. Cap portions (30) (insulating layers) formed over trenches (13) and covering doped polysilicon (5) have an inclined surface (26) which satisfies $Y/X \leq 5$ where X is the length of the inclined surface (26) in a direction of the surface of a body (50) and Y is the height of the inclined surface (26) from the surface of the body (50). Formation of the insulating layers having the smooth inclined surface satisfying $Y/X \leq 5$ permits a first main electrode to be formed non-defectively without being affected by the ground pattern including the insulating layers.

25 Claims, 11 Drawing Sheets

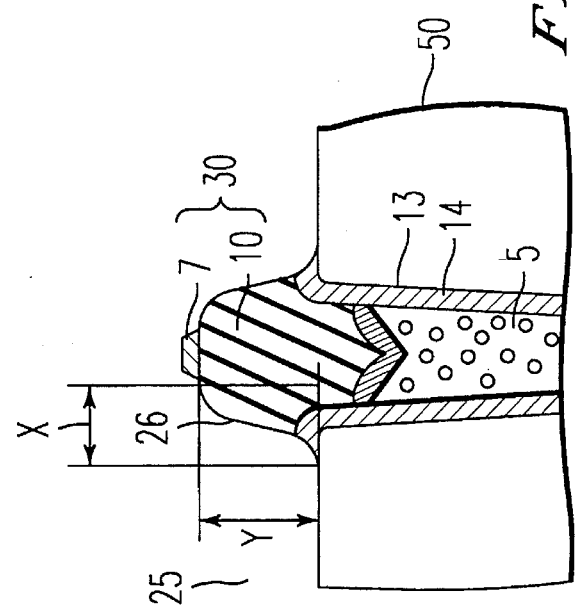
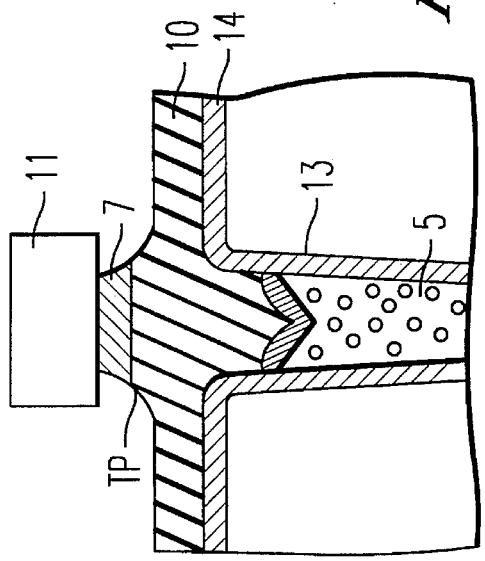
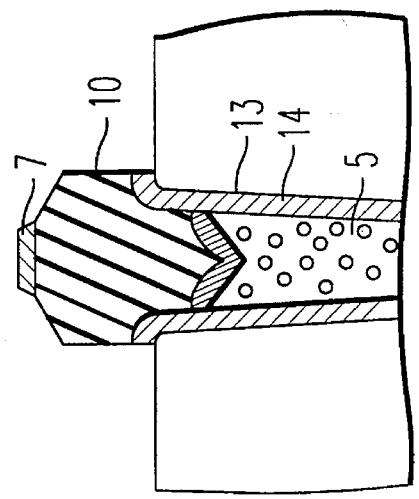

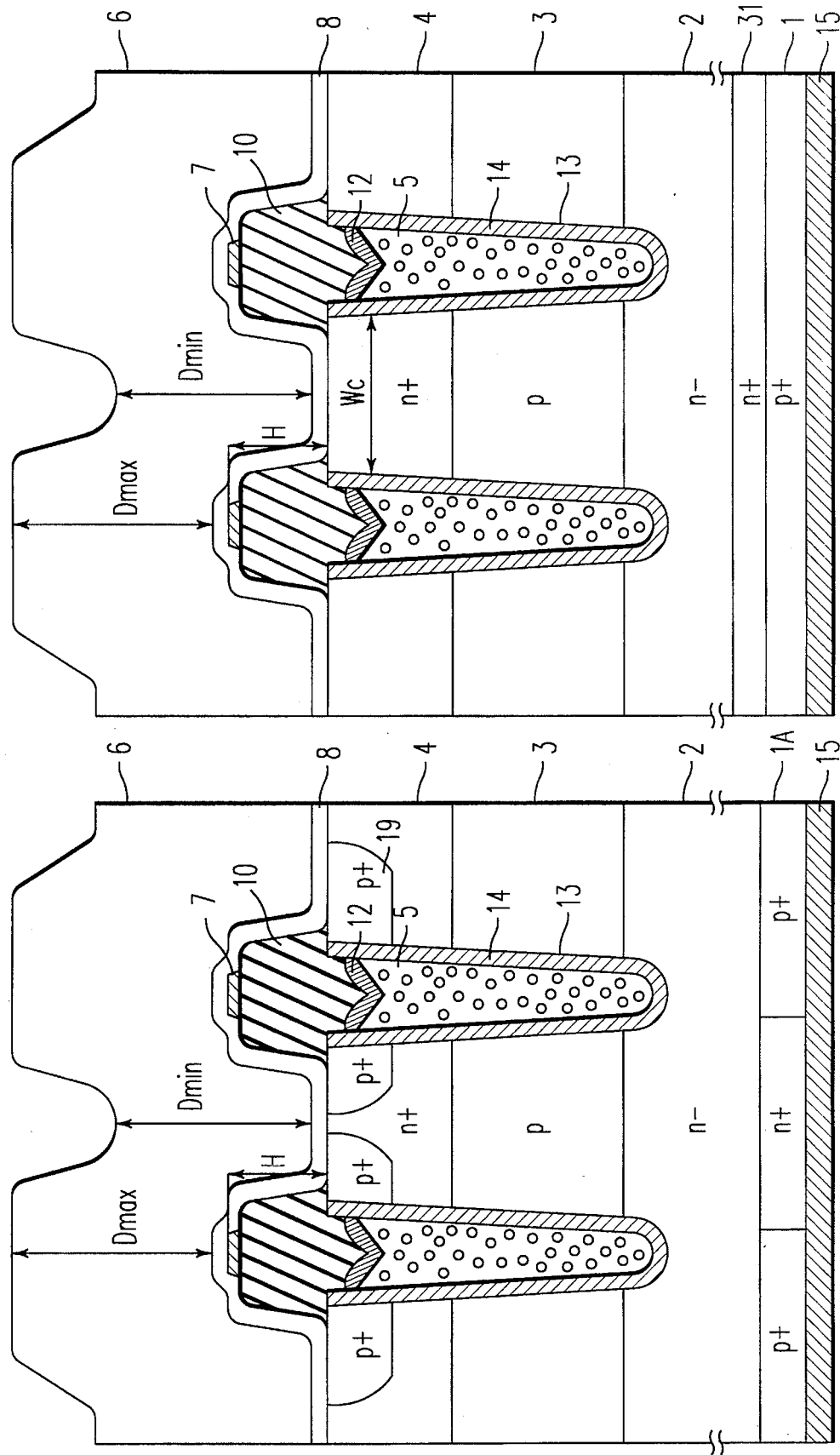

5,508,534

TRENCH GATE TYPE INSULATED GATE BIPOLAR TRANSISTOR

BACKGROUND OF THE INVENTION

1. Field of the Invention

The present invention relates to a semiconductor device such as an IGBT (insulated gate bipolar transistor) and a method of fabricating the same.

2. Description of the Background Art

Increase in performance of semiconductor devices essentially necessitates size reduction thereof, and the same is true for power semiconductor devices without exception. However, the further size reduction of the semiconductor devices has caused the surface of the semiconductor devices to be of more uneven configuration per unit area and has adversely affected element performance, fabrication steps, and reliability. For power semiconductor devices such as power transistors, power MOSFETs, IGBTs, thyristors, GTOs, MOS gate thyristors which have a current density ranging from several to make hundreds of amperes per square centimeter, in particular, high-priority challenges are: (1) to increase the thickness of surface aluminum electrode wiring; (2) to uniform the first thickness thereof; and (3) to flatten the surface aluminum electrode wiring.

Achievement of the second challenge (1) decreases the resistance of the aluminum electrode wiring to reduce power loss and increases the operating frequency of the device. Achievement of the third challenge (2) provides uniform resistances in the aluminum electrode wiring to allow safe operation of the whole device and expansion of a safe operating area (SOA). Achievement of the challenge (3) decreases contact resistances in wire bonding and pressure contact during package assembly for semiconductor chips.

Recently, with increasing integration and performance of general semiconductor devices, circuit patterns in the devices have been smaller in size and have been required to be formed with high accuracy.

On the other hand, the circuit patterns of power semiconductor devices were not much smaller than those of other semiconductor devices. In recent years, however, there has been an increasing tendency toward size reduction of the circuit patterns of power semiconductor devices for high integration and high performance, like the general semiconductor devices.

In the power semiconductor devices, a large number of process steps prior to the process step of forming electrode wiring for connection between electrodes or between an electrode and an external terminal often resulted in a surface configuration having high stepped portions before the formation of the electrode wiring.

Aluminum or an aluminum alloy such as AlSi is generally used for electrode wiring. It is, however, technically difficult to flatten Al or Al alloys, and improvements therein have been desired.

FIG. 28 is a schematic sectional view of a trench gate type IGBT (insulated gate bipolar transistor) which is a conventional power semiconductor device having a high stepped pattern in the electrode wiring.

Formation of electrode wiring in the conventional trench gate type IGBT will be described, as an example, with reference to FIG. 28.

As shown in FIG. 28, a $p^+$ semiconductor substrate 1 has first and second major surfaces, and an $n^-$ semiconductor layer 2 is formed on the first major surface of the $p^+$ semiconductor substrate 1. A p semiconductor layer 3 is formed on the $n^-$ semiconductor layer 2, and an $n^+$ semiconductor layer 4 is formed on the p semiconductor layer 3. A plurality of trenches 13 (two trenches in FIG. 28) are formed extending from the surface of the $n^+$ semiconductor layer 4 through the $n^+$ semiconductor layer 4 and p semiconductor layer 3 into parts of the surface of the $n^-$ semiconductor layer 2. The trenches 13 are of a Y-shaped cross-sectional configuration with a rounded bottom.

A silicon oxide film 14 is formed in the trenches 13 as a gate insulating film, and most of the inner region of each trench 13 is filled with doped polysilicon 5 which is a low-resistance conductive filler material, with the silicon oxide film 14 sandwiched between the doped polysilicon 5 and the inner wall of each trench 13. An example of the doped polysilicon 5 includes phosphorus-doped n-type polysilicon. The doped polysilicon 5 functions as a control electrode, and regions of the p semiconductor layer 3 adjacent the opposite outer wall surfaces of the trenches 13 serve as channel regions.

Silicon oxide films 7 are formed on the polysilicon 5, for example, in the manner to be described below. After the doped polysilicon 5, entirely filled in the trenches 13, is etched in some amounts in the direction of the depth of the trenches 13, the silicon oxide films 7 are formed on the doped polysilicon 5 by means of the CVD technique for the purpose of covering the openings of the trenches 13. The silicon oxide films 7 cap the openings of the trenches 13.

A high melting point metal film 8 serving as a silicide layer for low ohmic resistances or a barrier metal is deposited over the silicon oxide films 7, and an electrode wiring layer 6 made of an Al alloy is formed over the high melting point metal film 8. In this case, the high melting point metal film 8 is an alloy film.

In the conventional trench gate type IGBT as above constructed, a cavity or hollow 9 is produced in the electrode wiring layer 6 by reflecting the shape of the sharp tips of the silicon oxide films 7 on the doped polysilicon 5 in the trenches 13. The cavity or hollow in the electrode wiring layer 6 increases electrical resistances of the electrode wiring layer 6 which in turn fails to provide desired electrical characteristics.

In extreme cases, the cavity or hollow causes the electrode wiring layer 6 to be disconnected in the high stepped portions, resulting in fatal defects in terms of electrical resistances and reliability.

SUMMARY OF THE INVENTION

According to the present invention, a semiconductor device comprises: a semiconductor body having first and second major surfaces; a plurality of trench portions each selectively formed from the first major surface of the body to a predetermined depth; a plurality of insulating films formed on respective inner walls of the plurality of trench portions; a plurality of control electrode layers filled respectively in the plurality of trench portions, with the plurality of insulating films sandwiched between the control electrode layers and the inner walls of the trench portions; a plurality of insulating layers formed respectively on the plurality of control electrode layers and projecting from the first major surface of the body; a first main electrode formed over the first major surface of the body; and a second main electrode formed on the second major surface of the body, wherein a control voltage applied commonly to the plurality of control electrode layers controls current between the first and second main electrodes, and wherein each of the plurality of insulating layers has a smooth inclined surface from top to bottom, and the conditional expression: Y/X≦5 is satisfied where X is a length of the inclined surface in a direction of the first major surface of the body and Y is a height of the inclined surface from the first major surface of the body.

In the semiconductor device of the present invention, as above described, the plurality of insulating layers formed over the plurality of respective trench portions have the inclined surface which satisfies the conditional expression: Y/X≦5 where X is the length of the inclined surface in the direction of the first major surface of the body and Y is the height of the inclined stirface from the first major surface of the body. The stepped portion from the first major surface of the body which results from the formation of the plurality of insulating layers does not adversely affect the overlying layer.

As a result, the first main electrode is formed with good covering property on the plurality of insulating layers, and the semiconductor device is provided which includes the first main electrode formed non-defectively without the influence of the ground pattern.

According to another aspect of the present invention, a semiconductor device comprises: a body of semiconductor having first and second major surfaces; a plurality of trench portions each selectively formed from the first major surface of the body to a predetermined depth; a plurality of insulating films formed over respective inner walls of the plurality of trench portions and part of the first major surface of the body; a plurality of control electrode layers filled respectively in the plurality of trench portions, with the plurality of insulating films sandwiched between the control electrode layers and the inner walls of the trench portions, and extending over the part of the first major surface of the body, with the plurality of insulating films sandwiched between the control electrode layers and the body; a plurality of insulating layers formed respectively on the plurality of control electrode layers in the plurality of trench portions and projecting from the first major surface of the body; a first main electrode formed over the first major surface of the body; and a second main electrode formed on the second major surface of the body, wherein a control voltage applied commonly to the plurality of control electrode layers controls current between the first and second main electrodes, and wherein the conditional expression: H2≧H1 is satisfied where H1 is a height of the plurality of control electrode layers formed over the part of the first major surface of the body from the first major surface of the body and H2 is a height of the plurality of insulating layers over the plurality of trench portions from the first major surface of the body.

In the semiconductor device of the second aspect of the present invention, the plurality of insulating layers formed over the plurality of respective trench portions satisfy the conditional expression: H2≧H1 where H1 is the height of the plurality of control electrode layers formed over the part of the first major surface of the body from the first major surface of the body and H2 is the height of the plurality of insulating layers over the plurality of trench portions from the first major surface of the body. The plurality of insulating layers also cover the control electrode layers formed on the first major surface of the body, whereby the insulating layers have a relatively flat surface.

The result is the first main electrode is formed with good covering property on the plurality of insulating layers. The semiconductor device is provided which includes the first main electrode formed non-defectively without the influence of the ground pattern.

According to a third aspect of the present invention, a semiconductor device comprises: a body of semiconductor having first and second major surfaces; a plurality of trench portions each selectively formed from the first major surface of the body to a predetermined depth; a plurality of insulating films formed over respective inner walls of the plurality of trench portions and part of the first major surface of the body; a plurality of control electrode layers filled respectively in the plurality of trench portions, with the plurality of insulating films sandwiched between the control electrode layers and the inner walls of the trench portions, and extending over the part of the first major surface of the body, with the plurality of insulating films sandwiched between the control electrode layers and the body; a plurality of insulating layers formed respectively on the plurality of control electrode layers in the plurality of trench portions and projecting from the first major surface of the body; a first main electrode formed over the first major surface of the body; and a second main electrode formed on the second major surface of the body, wherein a control voltage applied commonly to the plurality of control electrode layers controls current between the first and second main electrodes, and wherein each of the plurality of insulating layers over the plurality of trench portions has a smooth inclined surface from top to bottom, and the conditional expression: H2≧H1 and the conditional expression: Y/X≦5 are both satisfied where X is a length of the inclined surface in a direction of the first major surface of the body, Y is a height of the inclined surface from the first major surface of the body, H1 is a height of the plurality of control electrode layers formed over the part of the first major surface of the body from the first major surface of the body, and H2 is a height of the plurality of insulating layers over the plurality of trench portions from the first major surface of the body.

In the semiconductor device of the third aspect of the present invention, the plurality of insulating layers formed over the plurality of respective trench portions have the inclined surface which satisfies the above-mentioned conditional expression Y/X≦5. The stepped portion from the first major surface of the body which results from the formation of the plurality of insulating layers does not so adversely affect the overlying layer.

Further, the plurality of insulating layers satisfy the above-mentioned conditional expression: H2≧H1. The plurality of insulating layers also cover the control electrode layers formed on the first major surface of the body, whereby the insulating layers have a relatively flat surface.

The result is the first main electrode is formed with good covering property on the plurality of insulating layers. The semiconductor device is provided which includes the first main electrode formed non-defectively without the influence of the ground pattern.

Preferably, the plurality of trench portions are spaced a predetermined distance apart from each other, and the conditional expression: (W/H)≦8 is satisfied where W is the predetermined distance and it is a height of the plurality of insulating layers from the first major surface of the body.

Thus, the integration is held at a relatively high level.

As a result, the semiconductor device is provided which includes the first main electrode formed non-defectively without the influence of the ground pattern while holding the high level of integration.

Preferably, each of the plurality of insulating layers includes: a ground insulating layer formed on each of the control electrode layers; and a major insulating layer formed on the ground insulating layer.

Thus, the ground insulating layers prevent interference between the major insulating layers and the control electrode layers.

Consequently, the presence of the ground insulating layers reliably avoids the likelihood that the major insulating layers adversely affect the control electrode layers during the fabrication, thereby allowing the accurate semiconductor device.

Preferably, each of the plurality of insulating layers includes: a ground insulating layer formed on each of the control electrode layers; a major insulating layer formed on the ground insulating layer; and an auxiliary insulating layer formed on the major insulating layer.

The formation of the auxiliary insulating layers on the major insulating layers allows the insulating layers to be of a desired height relatively easily, facilitating the accomplishment of the above described conditional expression H2≧H1.

The result is the first main electrode formed with good covering property on the plurality of insulating layers.

According to a fourth aspect of the present invention, a semiconductor device comprises: a body having first and second major surfaces and including an upper layer portion adjacent the first major surface and a lower layer portion adjacent the second major surface, at least the upper layer portion being made of semiconductor of a first conductivity type; a plurality of first semiconductor regions of a second conductivity type selectively formed in the upper layer portion of the body; a plurality of second semiconductor regions of the first conductivity type selectively formed in respective surfaces of the plurality of first semiconductor regions; a plurality of insulating films each formed on one of the first semiconductor regions between the upper layer portion of the body and the second semiconductor regions; a plurality of control electrodes formed respectively on the plurality of insulating films; a plurality of insulating layers for covering the plurality of insulating films and the plurality of control electrodes, respectively; a first main electrode formed over the first major surface of the body; and a second main electrode formed on the second major surface of the body, wherein a control voltage applied commonly to the plurality of control electrodes controls current between the first and second main electrodes, and wherein each of the plurality of insulating layers has a smooth inclined surface from top to bottom, and the conditional expression: Y/X≦5 is satisfied where X is a length of the inclined surface in a direction of the first major surface of the body and Y is a height of the inclined surface from the first major surface of the body.

In the semiconductor device of the fourth aspect of the present invention, the plurality of insulating layers formed over the plurality of respective trench portions have the inclined surface which satisfies the above-mentioned conditional expression: Y/X≦5 where X is the length of the inclined surface in the direction of the first major surface of the body and Y is the height of the inclined surface from the first major surface of the body. The stepped portion from the first major surface of the body which results from the formation of the plurality of insulating layers does not so adversely after the overlying layer.

The result is the first main electrode formed with good covering property on the plurality of insulating layers. The semiconductor device is provided which includes the first main electrode formed non-defectively without the influence of the ground pattern.

Preferably, the plurality of control electrodes are spaced a predetermined distance apart from each other, and the conditional expression: (W/H)≦8 is satisfied where W is the predetermined distance and H is a height of the plurality of insulating layers from the first major surface of the body.

Thus, the integration is held at a relatively high level.

As a result, the semiconductor device is provided which includes the first main electrode formed non-defectively without the influence of the ground pattern while holding the high level of integration.

The present invention is also intended for a method of fabricating a semiconductor device. According to the present invention, the method comprises the steps of: (a) providing a body of semiconductor having first and second major surfaces; (b) selectively forming a plurality of trench portions extending from the first major surface of the body to a predetermined depth; (c) forming a plurality of control electrode layers filling the plurality of trench portions, respectively, and extending over part of the first major surface of the body, the operation of the device being controlled by a control voltage applied commonly to the plurality of control electrode layers after completion of the device; (d) forming an insulating layer on the first major surface of the body including the plurality of control electrode layers; (e) patterning the insulating layer to form an opening in a predetermined position; and (f) performing heat treatment upon the patterned insulating layer to form a smooth inclined surface adjacent the opening of the insulating layer, wherein the heat treatment in the step (f) is carried out above a temperature at which the insulating layer is softened.

In the method of the present invention, since the method comprises the step of (f) performing heat treatment upon the patterned insulating layer above the temperature at which the insulating layer is softened to form the smooth inclined surface adjacent the opening of the insulating layer, the stepped portion from the first major surface of the body which results from the formation of the insulating layer does not so adversely affect the overlaying layer by the presence of the inclined surface.

The result is the layer formed with good covering property on the insulating layer. The layer is formed non-defectively without the influence of the ground pattern including the insulating layer.

Preferably, the method further comprises the step of: (g) performing heat treatment upon the insulating layer to flatten a surface of the insulating layer after the step (d), and the heat treatment in tile step (g) is carried out above a temperature at which the insulating layer is softened.

Since the method comprises the step of (g) performing heat treatment upon the insulating layer above the temperature at which the insulating layer is softened to flatten the surface of the insulating layer. As the surface of the insulating layer is flattened, the stepped portion from the first major surface of the body which results from the formation of the insulating layer does not so adversely affect the overlaying layer.

The result is the layer formed with good covering property on the insulating layer. The layer is formed non-defectively without the influence of the ground pattern including the insulating layer.

According to another aspect of the present invention, a method of fabricating a semiconductor device, comprises the steps of: (a) providing a body of semiconductor having first and second major surfaces; (b) selectively forming a plurality of trench portions extending from the first major surface of the body to a predetermined depth; (c) forming a plurality of control electrode layers filling the plurality of trench portions, respectively, and extending over part of the first major surface of the body, the operation of the device being controlled by a control voltage applied commonly to the plurality of control electrode layers after completion of the device; (d) forming an insulating layer on the first major surface of the body including the plurality of control electrode layers; (e) performing heat treatment upon the insulating layer to flatten a surface of the insulating layer; (f) forming an overlying insulating layer on the insulating layer; (g) forming a resist on the overlying insulating layer; (h) patterning the resist; (i) etching the insulating layer and the overlying insulating layer, using the patterned resist as a mask, to form an opening in a predetermined position; and (j) performing heat treatment upon the etched insulating layer and overlying insulating layer to form a smooth inclined surface adjacent the opening of the insulating layer and overlying insulating layer, wherein the heat treatment in the steps (e) and (i) is carried out above a temperature at which at least the insulating layer is softened, and wherein the overlaying insulating layer is more adherent to the resist than the insulating layer.

In this method of the present invention, the use of the overlying insulating layer which is more adherent to the resist than the insulating layer permits the resist to be formed with good adhesion on the overlaying insulating layer.

As a result, the patterning of the resist and the etching using the patterned resist as a mask are performed with high accuracy, whereby the high-accuracy semiconductor device is fabricated.

Preferably, the inclined surface of the insulating layer satisfies the conditional expression: $Y/X \leq 5$ where X is a length of the inclined surface in a direction of the first major surface of the body and Y is a height of the inclined surface from the first major surface of the body.

Thus, the stepped portion from the first major surface of the body which results from the formation of the insulting layer does not so adversely affect the overlaying layer.

The result is the layer formed with good covering property on the insulating layer. The layer is formed non-defectively without the influence of the ground pattern including the insulating layer.

Preferably, the control electrode layers and the insulating layer satisfy the conditional expression: $H2 \geq H1$ where H1 is a height of the control electrode layers formed over the part of the first major surface of the body from the first major surface of the body and H2 is a height of the insulating layer from the first major surface of the body.

The insulating layer also covers the control electrode layers formed on the first major surface of the body, whereby the insulating layer has the relatively flat surface.

The result is the layer formed with good covering property on the insulating layer. The layer is formed non-defectively without the influence of the ground pattern including the insulating layer.

Preferably, the control electrode layers and the insulating layer satisfy both the conditional expression: $Y/X \leq 5$ and the conditional expression: $H2 \geq H1$ where X is a length of the inclined surface in a direction of the first major surface of the body, Y is a height of the inclined surface from the first major surface of the body, H1 is a height of the control electrode layers formed over the part of the first major surface of the body from the first major surface of the body, and H2 is a height of the insulating layer from the first major surface of the body.

Since the insulating layers has the inclined surface which satisfies the above-described conditional expression $Y/X \leq 5$, the stepped portion from the first major surface of the body which results from the formation of the insulating layer does not so adversely affect the overlaying layer.

Further, since the insulating layer satisfies the conditional expression $H2 \geq H1$, the insulating layer also covers the control electrode layers formed on the first major surface of the body, and the insulating layer has the relatively flat surface.

The result is the layer formed with good covering property on the insulating layer. The layer is formed non-defectively without the influence of the ground pattern including the insulating layer.

Preferably, the plurality of trench portions are spaced a predetermined distance apart from each other, and the conditional expression: $(W/H) \leq 8$ is satisfied where W is the predetermined distance and H is a height of the insulating layer over the trench portions from the first major surface of the body.

Thus, the integration is held at a relatively high level.

Consequently, the layer is formed non-defectively without the influence of the ground pattern including the insulating layer while the high level of integration is held.

Preferably, the insulating layer includes a ground insulating layer and a major insulating layer, and the step (d) includes the steps of: (d-1) forming the ground insulating layer on the plurality of control electrode layers; and (d-2) forming the major insulating layer on the first major surface of the body including the ground insulating layer.

The ground insulating layer can prevent the adverse effect from being transmitted from the major insulating layer to the control electrode layers during the heat treatment in the steps (e) and (i).

The result is the fabrication of the high-accuracy semiconductor device whose perfbrmance is not deteriorated by heat treatment.

Preferably, the step (i) includes the steps of: (i-1) performing isotropic etching upon at least the overlying insulating layer, using the patterned resist as a mask; and (i-2) performing anisotropic etching upon at least the insulating layer, using the patterned resist as a mask, to form an opening in a predetermined position of the overlying insulating layer and the insulating layer after the step (i-1).

Since the etching in the step (i) includes the step (i-1) to form a tapered portion in an upper portion of the overlaying insulating layer and the insulating layer, the stepped portion from the first major surface of the body which results from the formation of the overlying insulating layer and the insulting layer does not so adversely affect the overlaying layer.

The result is the layer formed with better covering property on the overlaying insulating layer and the insulating layer, and the layer is formed non-defectively without the influence of the ground pattern including the insulating layer.

Preferably, the step (c) includes the steps of: (c-1) forming an insulating film completely covering inner walls of the plurality of trench portions and extending over part of the first major surface of the body; and (c-2) forming the plurality of control electrode layers respectively filling the plurality of trench portions, with the insulting film sandwiched between the control electrode layers and the inner walls of the trench portions, and extending over the part of the first major surface of the body, with the insulating film sandwiched between the control electrode layers and the body.

Thus, the control electrode layers may be used as an insulated control electrode.

According to still another aspect of the present invention, a method of fabricating a semiconductor device, comprises the steps of: (a) providing a body having first and second major surfaces and including an upper layer portion adjacent the first major surface and a lower surface portion adjacent the second major surface, the tapper layer portion being made of semiconductor of a first conductivity type, and then forming an MOS structure including a plurality of first semiconductor regions of a second conductivity type selectively formed in the upper layer portion of the body, a plurality of second semiconductor regions of the first conductivity type selectively formed in respective surfaces of the plurality of first semiconductor regions, a plurality of insulating films each formed on one of the first semiconductor regions between the tapper layer portion of the body and the second semiconductor regions, and a plurality of control electrodes formed on the plurality of insulating films, respectively; (b) forming an insulating layer on the first major surface of the body including the plurality of control electrodes; (c) patterning the insulating layer to form an opening in a predetermined position; (d) performing heat treatment upon the patterned insulating layer to form a smooth inclined surface adjacent the opening of the insulating layer; (e) forming a first main electrode over the first major surface of the body; and (f) forming a second main electrode on the second major surface of the body, wherein a control voltage applied commonly to the plurality of control electrodes after completion of the device controls current between the first and second main electrodes, and wherein the heat treatment in the step (d) is carried out above a temperature at which the insulating layer is softened.

Since the method comprises the step of performing heat treatment upon the patterned insulating layer above the temperature at which the insulating layer is softened to form the smooth inclined surface adjacent the opening of the insulating layer, the stepped portion from the first major surface of the body which results from the formation of the insulating layer does not so adversely affect the overlying layer by the presence of the inclined surface.

The result is the layer formed with good covering property on the insulating layer, and the layer is formed non-defectively without the influence of the ground pattern including the insulating layer.

Preferably, the inclined surface of the insulating layer satisfies the conditional expression: $Y/X \leq 5$ where X is a length of the inclined surface in a direction of the first major surface of the body and Y is a height of the inclined surface from the first major surface of the body.

The stepped portion from the first major surface of the body which results from the formation of the insulating layer does not so adversely affect the overlying layer.

The result is the layer formed with good covering property on the insulating layer, and the layer is formed non-defectively without the influence of the ground pattern including the insulating layer.

Preferably, the plurality of control electrodes are spaced a predetermined distance apart from each other, and the conditional expression: $(W/H) \leq 8$ is satisfied where W is the predetermined distance and it is a height of the insulating layer from the first major surface of the body.

Thus, the integration is held at a relatively high level.

As a result, the layer is formed non-defectively without the influence of the ground pattern including the insulating layer while the high level of integration is held.

Preferably, the plurality of control electrodes are spaced a predetermined distance apart from each other, and the control electrodes and the insulating layer satisfy the conditional expression: $Y/X \leq 5$ and the conditional expression: $(W/H) \leq 8$ where W is the predetermined distance, H is a height of the insulating layer from the first major surface of the body, X is a length of the inclined surface in a direction of the first major surface of the body, and Y is a height of the inclined surface from the first major surface of the body.

While the integration is held at a relatively high level, the stepped portion from the first major surface of the body which results from the formation of the insulating layer does not so adversely affect the overlying layer.

As a result, the layer is formed non-defectively without the influence of the ground pattern including the insulating layer while the high level of integration is held.

When a "trench portion" is used in the specification it is used as a convenience to include both general trenches having a given width and a given depth and holes having a depth greater than their width.

The equal sign in "$\geq$" and the like used for conditional expressions in the specification does not mean exact equality but approximate equality.

It is an object of the present invention to provide a semiconductor device which include a layer formed non-defectively without being affected by a stepped ground pattern, and a method of fabricating the same.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 to 10 are cross-sectional views illustrating a fabrication method of the first preferred embodiment;

FIG. 24 is a cross-sectional view of a trench gate type MCT according to a fourth preferred embodiment of the present invention;

FIG. 25 is a cross-sectional view of a first modification of the IGBT of the first preferred embodiment;

DESCRIPTION OF THE PREFERRED EMBODIMENTS

<<First Preferred Embodiment>>
<Construction>

Figure 1:
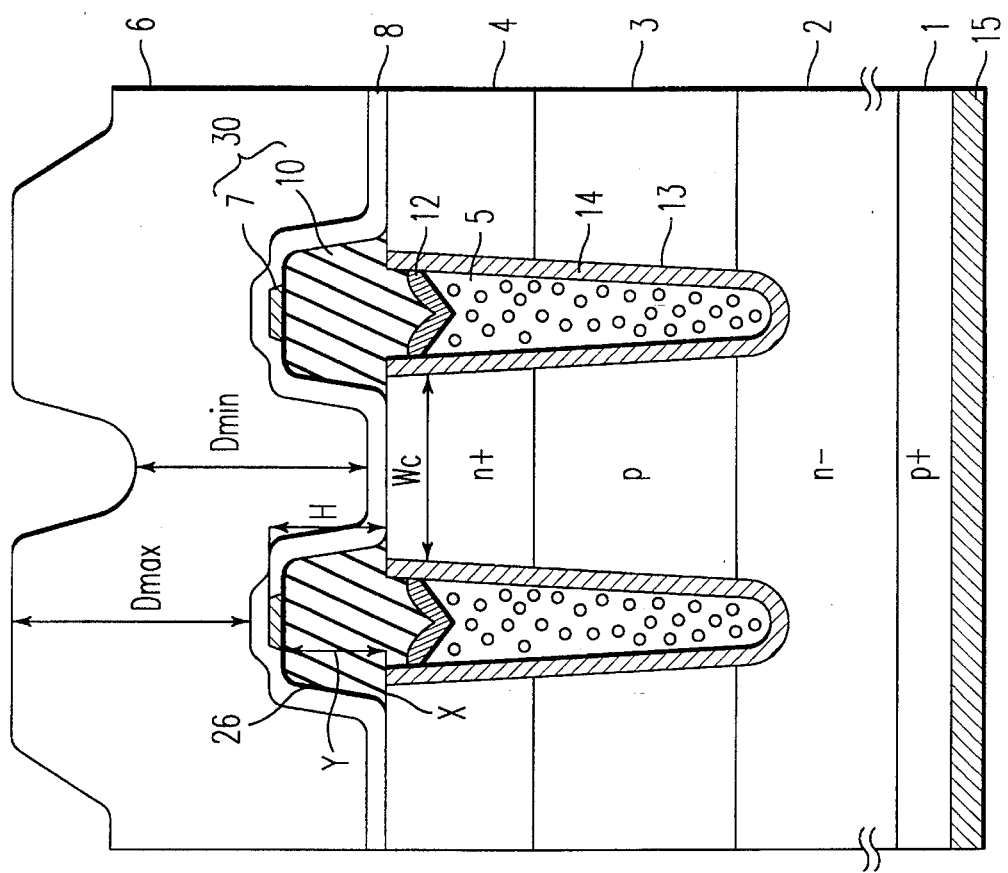
FIG. 1 is a cross-sectional view of a trench gate type IGBT according to a first preferred embodiment of the present invention.

FIG. 1 is a sectional view of a trench gate type IGBT according to a first preferred embodiment of the present invention. As shown in FIG. 1, a $p^+$ semiconductor substrate 1 has first and second major surfaces, and an $n^-$ semiconductor layer 2 is formed on the first major surface of the $p^+$ semiconductor substrate 1. A p semiconductor layer 3 is formed on the $n^-$ semiconductor layer 2, and an $n^+$ semiconductor layer 4 is formed on the p semiconductor layer 3. A plurality of trenches 13 (two trenches in FIG. 1) are formed extending from the surface of the $n^+$ semiconductor layer 4 through the $n^+$ semiconductor layer 4 and p semiconductor layer 3 into parts of the surface of the $n^-$ semiconductor layer 2. The trenches 13 are of a Y-shaped cross-sectional configuration with rounded bottom.

A silicon oxide film 14 is formed in the trenches 13 as a gate insulating film, and most of the inner region of each trench 13 is filled with doped polysilicon 5 which is a low-resistance conductive filler material, with the silicon oxide film 14 sandwiched between the doped polysilicon 5 and the inner wall of each trench 13. An example of the doped polysilicon 5 includes phosphorus-doped n-type polysilicon. The doped polysilicon 5 functions as an insulated gate control electrode, with the silicon oxide films 14 sandwiched between the doped polysilicon 5 and the inner walls of the trenches 13, and regions of the p semiconductor layer 3 adjacent the opposite outer wall surfaces of the trenches 13 serve as channel regions.

Thin CVD oxide films 12 are formed on the doped polysilicon 5, and a plurality of BPSG (borophosphosilicate glass) films 10 are formed respectively to cover the trenches 13 including the CVD oxide films 12. Silicon oxide films 7 are formed on top of the BPSG films 10, respectively. The BPSG films 10 and the silicon oxide films 7 form a plurality of cap portions 30 for capping the openings of the trenches 13.

A high melting point metal film 8 is formed over the surface of the $n^+$ semiconductor layer 4 including the plurality of cap portions 30, and an electrode wiring layer 6 sewing as an emitter electrode is formed over the high melting point metal film 8.

<Trench Gate Structure>

Figure 12:
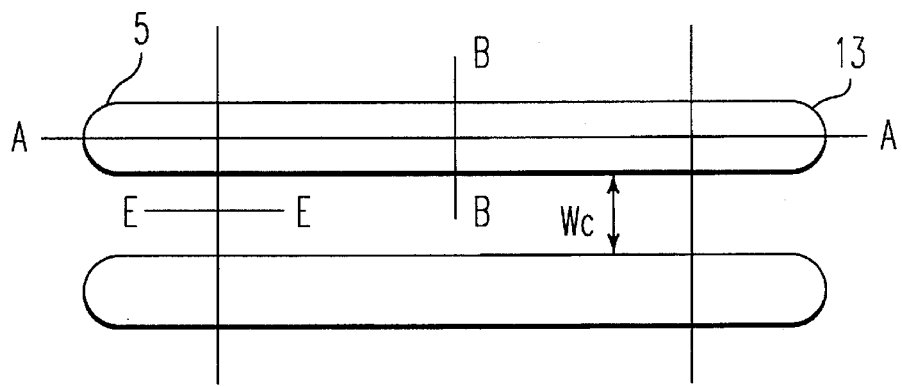
FIG. 12 is a plan view of a part of the IGBT of the first preferred embodiment.

FIG. 12 is a plan view showing the plan configuration of the trench gate type IGBT of FIG. 1. The trenches 13 are spaced a width Wc apart from each other, as shown in FIG. 12.

In FIGS. 12 to 17, the $p^+$ semiconductor substrate 1, the $n^-$ semiconductor layer 2, the p semiconductor layer 3, and the $n^+$ semiconductor layer 4 are illustrated as a single body 50 made of semiconductor, and the silicon oxide films 7 are not shown.

Figure 13:
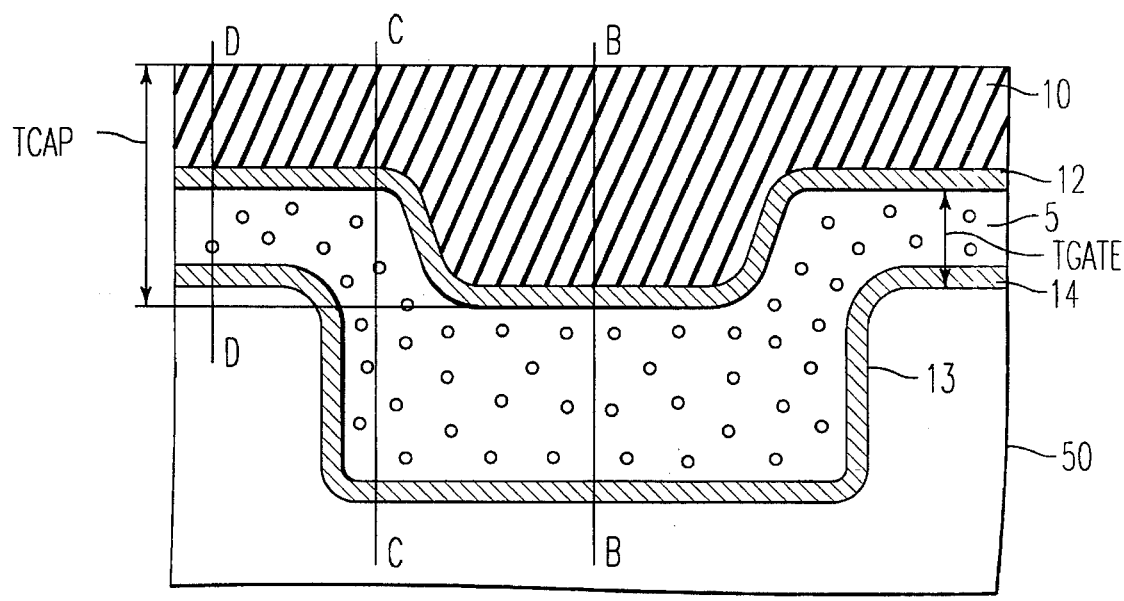
FIG. 13 is a cross-sectional view taken along the line A—A of FIG. 12.

FIG. 13 is a cross-sectional view taken along the line A—A of FIG. 12. Referring to FIG. 13, the trench 13 extends from the surface of the body 50 toward the rear face thereof, and the silicon oxide film 14 extends from the inner wall surface of the trench 13 to the surface of the body 50. The doped polysilicon 5 is filled in the trench 13 and extends to over part of the surface of the body 50, with the silicon oxide film 14 sandwiched between the doped polysilicon 5 and the body 50. The CVD oxide film 12 is formed on the doped polysilicon 5, and the BPSG film 10 is formed on the CVD oxide film 12. The BPSG film 10 has a height tcap from the surface of the body 50, and the doped polysilicon 5 has a height tgate from the surface of the body 50.

Figures 14, 15:
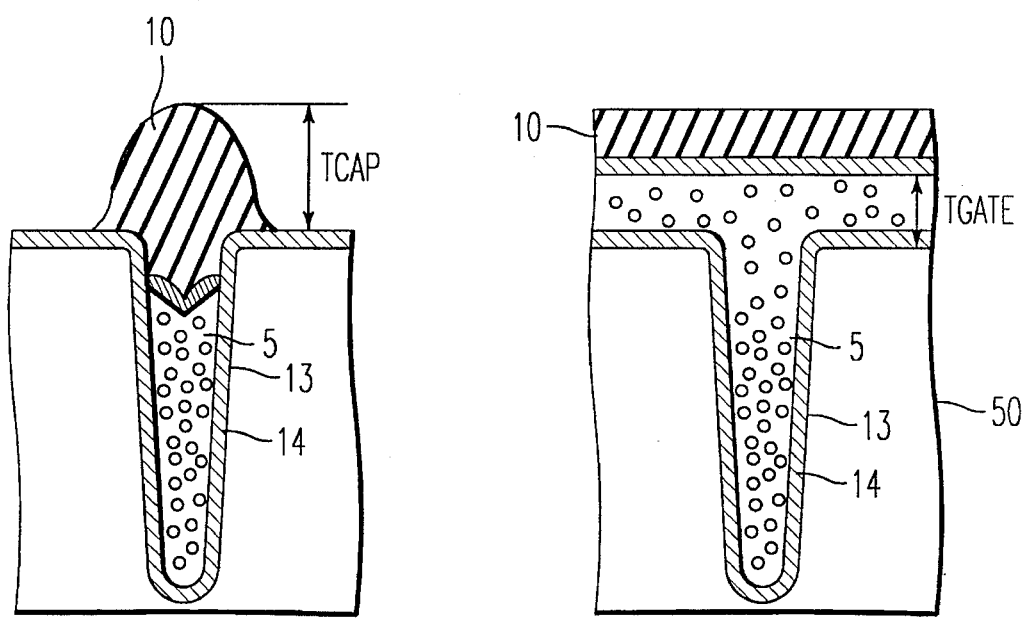
FIG. 14 is a cross-sectional view taken along the line B—B of FIG. 12.
FIG. 15 is a cross-sectional view taken along the line C—C of FIG. 13.

FIG. 14 is a cross-sectional view taken along the line B—B of FIG. 12. This cross section corresponds to the cross section of FIG. 1. It will be understood that the BPSG film 10 on the trench 13 has the height tcap from the surface of the body 50.

FIG. 15 is a sectional view taken along the line C—C of FIG. 13. Referring to FIG. 15, the doped polysilicon 5 is filled in the trench 13 and extends over the surface of the body 50 with the height tgate from the surface of the body 50, with the silicon oxide film 14 sandwiched between the doped polysilicon 5 and the body 50. The CVD oxide film 12 and the BPSG film 10 are formed over the doped polysilicon 5.

Figure 16:
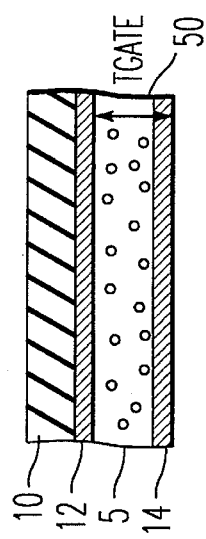
FIG. 16 is a cross-sectional view taken along the line D—D of FIG. 13.

FIG. 16 is a cross-sectional view taken along the line D—D of FIG. 13. Referring to FIG. 16, the doped polysilicon 5 is formed over the surface of the body 50, with the silicon oxide film 14 sandwiched between the doped polysilicon 5 and the body 50. The CVD oxide film 12 and the BPSG film 10 are formed over the doped polysilicon 5. The doped polysilicon 5 has the height tgate from the surface of the body 50.

Figure 17:
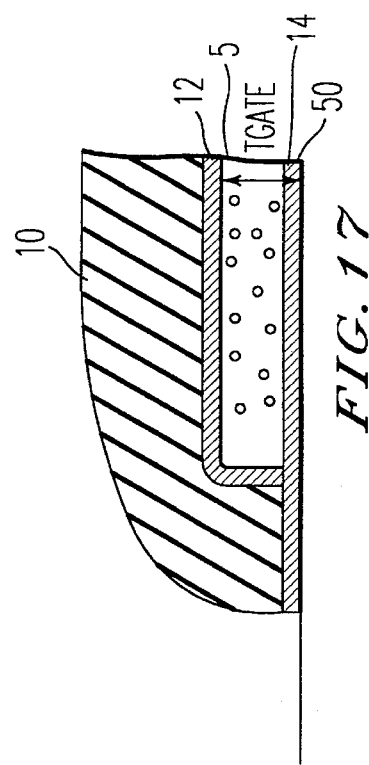
FIG. 17 is a cross-sectional view taken along the line E—E of FIG. 12.

FIG. 17 is a cross-sectional view taken along the line E—E of FIG. 12. As shown in FIG. 17, the silicon oxide film 14 is formed on the surface of the body 50, and the doped polysilicon 5 having the height tgate from the surface of the body 50 is formed over part of the surface of the body 50, with the silicon oxide film 14 sandwiched between the doped polysilicon 5 and the body 50. The CVD oxide film 12 covers the doped polysilicon 5, and the BPSG film 10 covers the doped polysilicon 5, with the CVD oxide film 12 therebetween.

In this manner, the doped polysilicon 5 extends over part of the surface of the body 50 with the height tgate from the surface of the body 50 for contact with the exterior. The BPSG film 10 (cap portion 30) having the height tcap from the surface of the body 50 is formed on the trench 13.

At this time, the conditional expression: tcap≧tgate is satisfied as shown in FIG. 13.

<Fabrication Method>

FIGS. 2 to 10 are cross-sectional views illustrating a method of forming the cap portions 30. The method of forming the cap portions 30 over the respective trenches 13 will be described below with reference to FIGS. 2 to 10.

Figure 2:
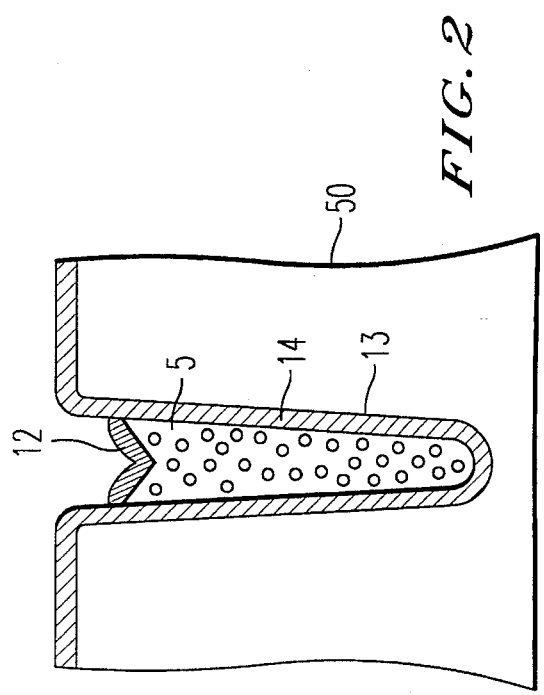

The structure of FIG. 2 is provided by means of the existing fabrication technique. That is, the $n^-$ semiconductor layer 2 is formed on the first major surface of the $p^+$ semiconductor substrate 1, and the p semiconductor layer 3 is formed on the n⁻ semiconductor layer 2. Then the n⁺ semiconductor layer 4 is formed on the p semiconductor layer 3 to provide the body 50. The plurality of trenches 13 of the Y-shaped configuration with rounded bottom and extending from the surface of the n⁺ semiconductor layer 4 through the n⁺ semiconductor layer 4 and p semiconductor layer 3 into the surface of the n⁻ semiconductor layer 2 are formed by the reactive ion etching (referred to hereinafter as RIE) technique. The silicon oxide film 14 is formed on the surface of the body 50 including the inner wall portion of each trench 13 by thermal oxidation.

The doped polysilicon 5 is filled in the trenches 13 and is formed so that it extends over part of the surface of the body 50, with the silicon oxide film 14 sandwiched between the doped polysilicon 5 and the body 50, as shown in FIGS. 13 and 15. After the doped polysilicon 5 filled in each of the trenches 13 is etched in some amounts in the direction of the depth of the trenches 13, the surface of the doped polysilicon 5 is oxidized by the CVD technique to form the silicon oxide film 12 as shown in FIG. 2.

Figure 3:
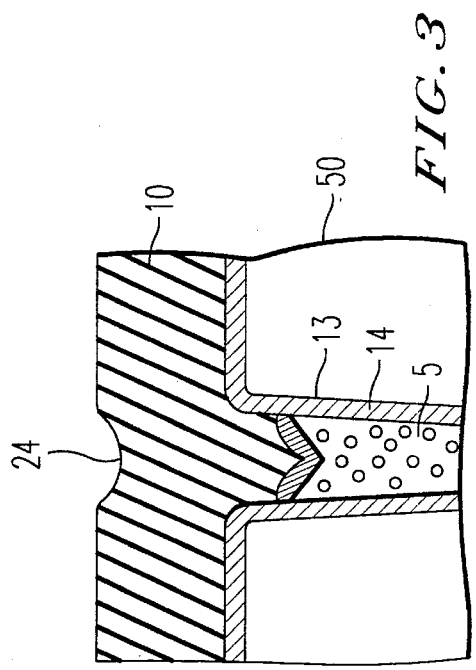

Then the BPSG film 10 serving as a layer insulation film is deposited as thick as 1 to 2 µm by the CVD (chemical vapor deposition) technique, as shown in FIG. 3.

Figure 4:
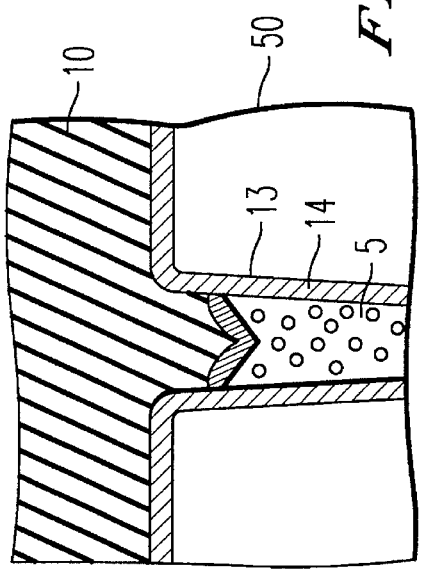

The BPSG film 10 is subjected to heat treatment at a temperature of 800° to 1000° C. in an oxidative ambient containing oxygen or water vapor (oxygen and hydrogen mixed combustion) for several minutes to several hours. The BPSG film 10 which has a softening point of about 800° C. is softened by the heat treatment and causes a so-called reflow phenomenon. The BPSG film 10 in portions other than a recess 24 of FIG. 3 flows into the recess 24 over the trench, thereby permitting the surface of the BPSG film 10 to be flattened as shown in FIG. 4. At this time, the silicon oxide film 12 insures prevention of the adverse effect of phosphorus or boron being diffused into the doped polysilicon 5 in the trench from the BPSG film 10.

Figure 5:
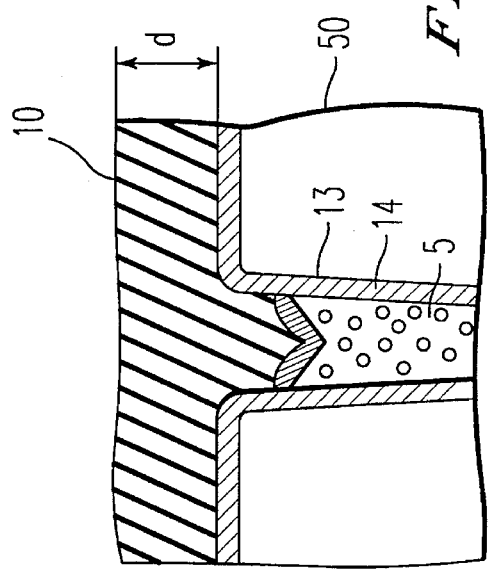
Figure 6:
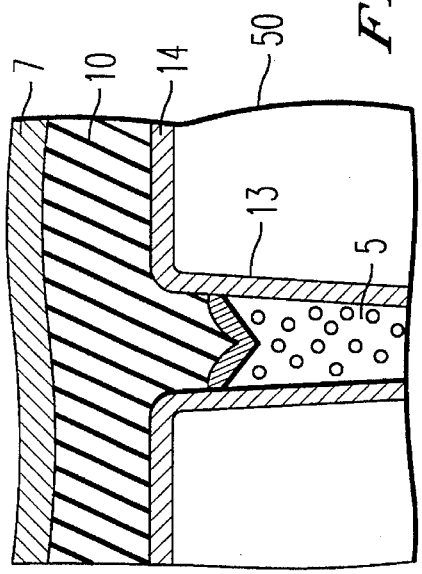

Referring to FIG. 5, the flattened BPSG film 10 is etched down to a thickness which permits anisotropic etching to be described later to expose the body 50 for ease of formation of contact holes. Specifically, the BPSG film 10 is etched down to a thickness d of about 3000 to 8000 angstroms by using an aqueous solution containing HF, for example.

Then the silicon oxide film 7 which is more adherent to a positive photoresist than the BPSG film 10 is deposited on the BPSG film 10, and a resist 11 which is a positive photoresist is formed on the silicon oxide film 7. The good adhesion of the silicon oxide film 7 to the resist 11 allows accurate patterning of the resist 11 and accurate etching using the patterned resist 11 as a mask which will be described later.

Figure 7:
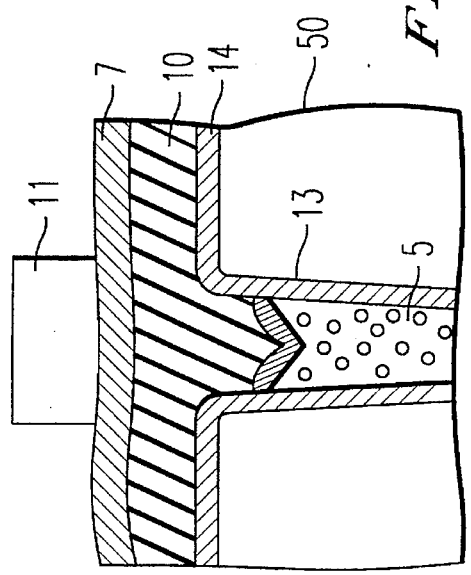

Referring to FIG. 7, the resist 11 is patterned by the photolithography technique. As shown in FIG. 8, masked with the patterned resist 11, the silicon oxide film 7 and the BPSG film 10 are subjected to etching which causes side-etching by using an aqueous solution containing HF. This produces undercut in the silicon oxide film 7 and BPSG film 10 to form a tapered portion TP.

Then anisotropic etching is carried out just to the mask dimension of the resist 11 to form a contact hole 25 and the silicon oxide film 7 and BPSG film 10 serving as the cap portion of the trench 13 as shown in FIG. 9. By the presence of the tapered portion TP of the silicon oxide film 7 and BPSG film 10 in an upper part of the cap portion 30, the electrode wiring layer 6 has a more improved covering property, than that of the background art if the electrode wiring layer 6 made of an Al alloy is formed on the cap portion including the BPSG film 10 and silicon oxide film 7 having the configuration of FIG. 9.

The silicon oxide film 7 and BPSG film 10 are subjected to heat treatment at a temperature of 800° to 1000° C. in a nitrogen ambient or in an oxidative ambient containing oxygen or water vapor (oxygen and hydrogen mixed combustion) for several minutes to several hours. The BPSG film 10 which has the softening point of about 800° C. is softened by the heat treatment and causes the reflow phenomenon. The BPSG film 10 is rounded in cross-sectional configuration to provide a smooth surface of a high stepped portion at a different level from the contact hole or the stirface of the body 50 as shown in FIG. 10. In this manner, the cap portion 30 including the BPSG film 10 and the silicon oxide film 7 is completed on each of the trenches 13.

Then a silicide layer (not shown) is formed on the surface of the body 50, and the high melting point metal film 8 is deposited by sputtering. Further, the electrode wiring layer 6 made of AlSi and the like is formed by sputtering. The formation of a smooth inclined surface 26 in cross section of the cap portion 30 insures the prevention of a cavity or hollow 9 which has been conventionally produced in the electrode wiring layer 6 if the electrode wiring layer 6 serving as an emitter electrode is formed so as to cover the cap portion 30 making the stepped portion or level difference from the body 50, thereby significantly improving the covering property of the electrode wiring layer 6.

Figure 11:
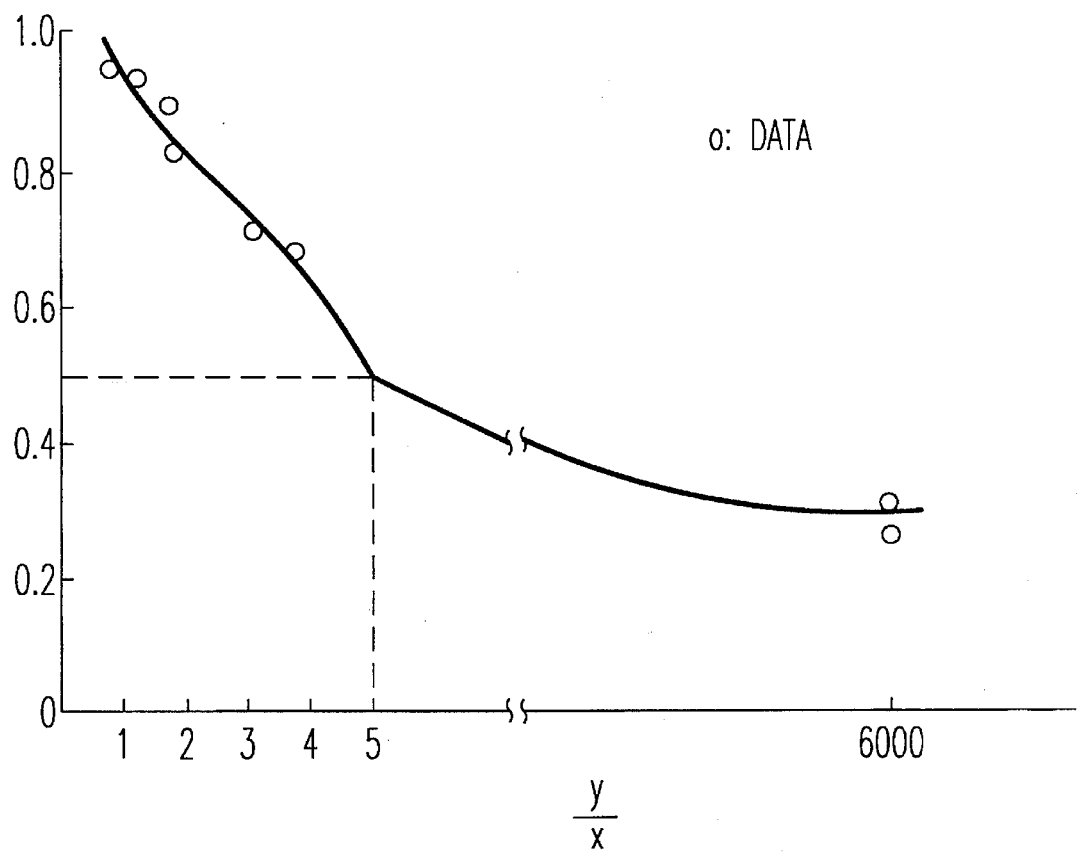
FIG. 11 is a graph for illustrating effects of the first preferred embodiment.

The improvement in the covering property will be discussed in detail. The smooth inclined surface 26 is formed in the cap portion 30 by the above-mentioned heat treatment in order to improve the covering property of the electrode wiring layer 6. As shown in FIG. 10, X represents the length of the inclined surface 26 in the direction of the surface of the body 50, and Y represents the height of the inclined surface 26 from the surface of the body 50. FIG. 11 illustrates the relation between Y/X and a parameter ratio Dmin/Dmax indicative of the covering property of the electrode wiring layer 6 where Dmin is the thickness of the electrode wiring layer 6 over the body 50 on which the cap portion 30 is not formed and Dmax is the thickness of the electrode wiring layer 6 over the cap portion 30. As the parameter Dmin/Dmax approaches 1, the electrode wiring layer 6 has better covering property.

It will be apparent from FIG. 11 that satisfaction of Y/X≦5 ensures the parameter Dmin/Dmax of not less than 0.5, providing relatively good covering property of the electrode wiring layer 6. Further, satisfaction of Y/X≦2 ensures the parameter Dmin/Dmax of not less than 0.8, providing very good covering property of the electrode wiring layer 6.

That is, the configuration of the inclined surface 26 of the cap portion 30 formed so that Y/X≦5 is satisfied holds the relatively good covering property of the electrode wiring layer 6, and the configuration thereof formed so that Y/X≦2 is satisfied holds the very good covering property of the electrode wiring layer 6 (first characteristic).

Consequently, the first characteristic permits the electrode wiring layer 6 to be formed with the good covering property over the cap portion 30 which is a stepped ground pattern on the body 50, thereby providing the IGBT non-defectively without the influence of the ground pattern upon the electrode wiring layer 6 serving as the emitter electrode.

Further, if the conditional expression: (Wc/H)≦8 is satisfied where H is the height of the cap portion 30 from the surface of the n⁺ semiconductor layer 4 and Wc is the spacing between the trenches 13, good covering property of the electrode wiring layer is maintained with a relatively high level of integration (second characteristic).

The satisfaction of the conditional expression: tcap≧tgate where tgate is the height of the doped polysilicon 5 from the surface of the body 50 and tcap is the height of the cap portion 30 from the surface of the body 50 over the trench 13, provides the BPSG film 10 (cap portion 30) with a flat surface over the body 50 as shown in FIG. 13 independently of the formation of the doped polysilicon 5 over the surface of the body 50. Therefore, the electrode wiring layer 6 over the cap portion 30 can hold the good covering property (third characteristic).

Consequently, the formation of the electrode wiring layer 6 with the good covering property over the cap portion 30 because of the third characteristic provides the IGBT formed non-defectively without the influence of the ground pattern upon the electrode wiring layer 6 serving as the emitter electrode.

<<Second Preferred Embodiment>>

Figure 18:
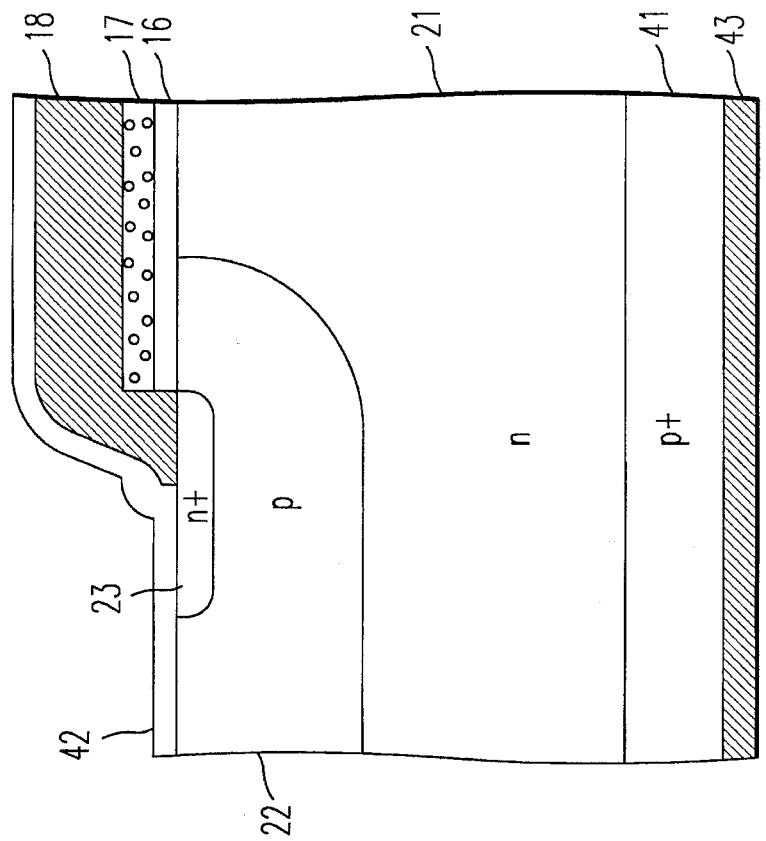
FIG. 18 is a cross-sectional view of a surface MOS gate type IGBT according to a second preferred embodiment of the present invention.
Figure 19:
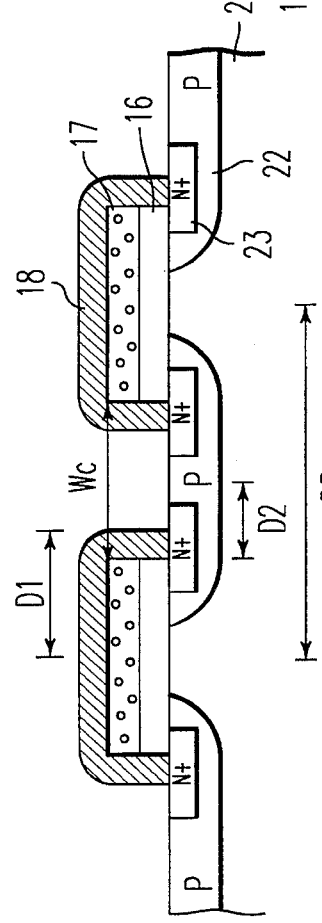
FIG. 19 is a cross-sectional view showing a surface arrangement of the IGBT of the second preferred embodiment.

FIG. 18 is a sectional view of an IGBT of a surface gate type MOS gate structure according to a second preferred embodiment of the present invention. FIG. 19 is a sectional view of the surface gate structure of the IGBT of FIG. 18. Referring to FIGS. 18 and 19, a $p^+$ substrate 41 has first and second major surfaces, and an n semiconductor layer 21 is formed on the first major surface of the $p^+$ substrate 41. A plurality of p diffused regions 22 are selectively formed in the surface of the n semiconductor layer 21, and $n^+$ diffused regions 23 are selectively formed on the plurality of p diffused regions 22.

A plurality of gate oxide films 16 are each formed over part of the surface of one of the $n^+$ diffused regions 23, the surface of one of the p diffused regions 22, the surface of the n semiconductor layer 21, the surface of another p diffused region 22, and part of the surface of another $n^+$ diffused region 23. Gate electrodes 17 are formed on the plurality of gate oxide films 16 and a plurality of insulating layers 18 cover the gate electrodes 17, respectively.

An emitter electrode 42 is formed over the insulating layers 18, the p diffused regions 22 and the $n^+$ diffused regions 23. A collector electrode 43 is formed on the second major surface of the $p^+$ substrate 41.

Figure 20:
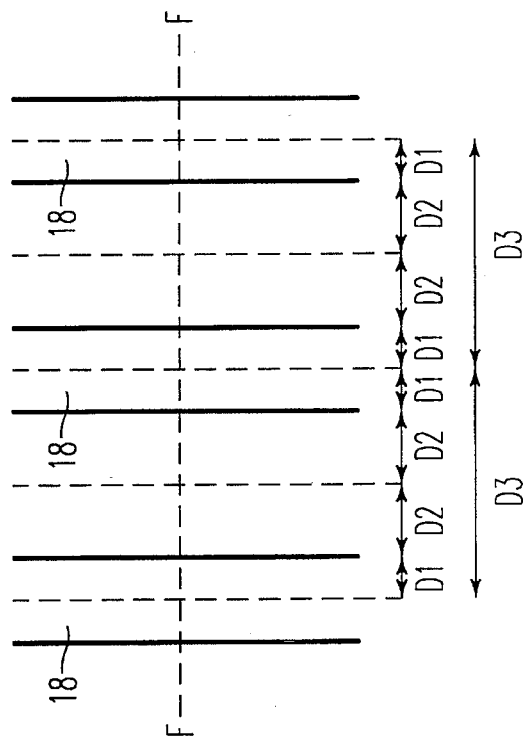
FIG. 20 is a plan view showing a first example of the surface arrangement of the IGBT of the second preferred embodiment.

FIG. 20 is a plan view illustrating a first example of the plan structure of the IGBT of the second preferred embodiment. The beltlike insulating layers 18 are spaced a distance D3 apart from each other, as shown in FIG. 20. The distances D1 to D3 of FIG. 20 correspond to D1 to D3 of FIG. 19, respectively.

Figure 21:
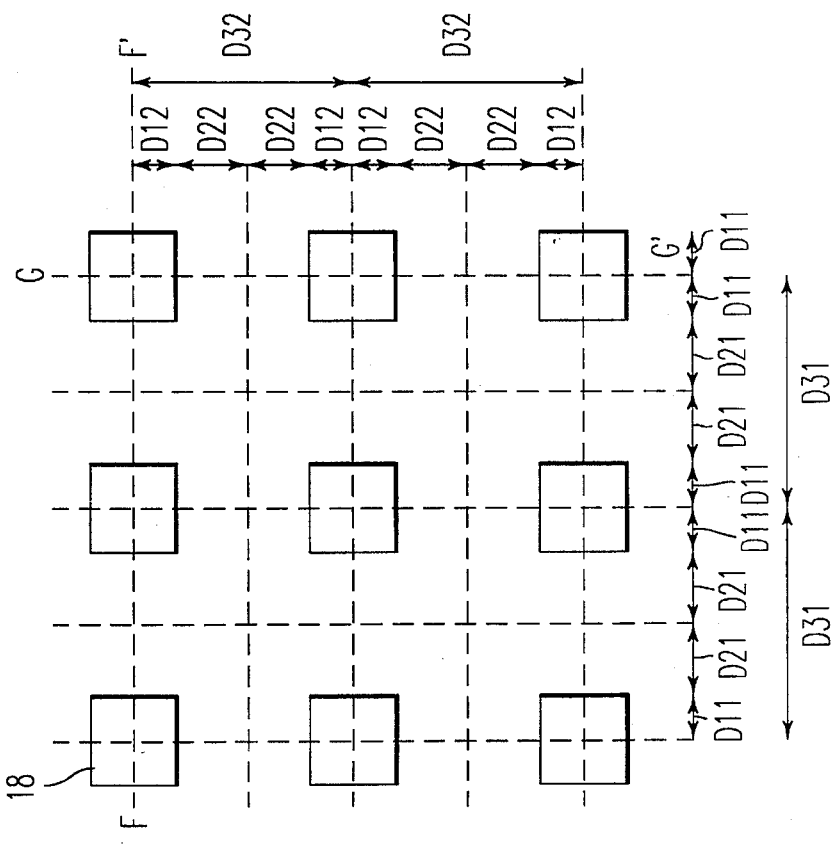
FIG. 21 is a plan view showing a second example of the surface arrangement of the IGBT of the second preferred embodiment.

FIG. 21 is a plan view illustrating a second example of the plan structure of the IGBT of the second preferred embodiment. As shown in FIG. 21, the rectangular insulating layers 18 are spaced a distance D31 apart from each other in the horizontal direction of FIG. 21 and spaced a distance D32 apart from each other in the vertical direction of FIG. 21. The distances D11, D21, D31 of FIG. 21 correspond respectively to D1, D2, D3 of FIG. 19 if taken along the line F-F', and the distances D12, D22, D32 of FIG. 21 correspond respectively to D1, D2, D3 of FIG. 19 if taken along the line G-G'. The distances D11, D12, D21, D22, D31, D32 may be of any size.

A third example of the plan structure of the IGBT of the second preferred embodiment may be designed such that the rectangular portions of FIG. 21 are drain and source regions and other regions are gate regions (regions in which the insulating layers 18 are formed).

A method of fabricating the IGBT of the second preferred embodiment will be discussed below. First, the n semiconductor layer 21 is formed on the first major surface of the $p^+$ substrate 41. Then the MOS gate structure comprised of the p diffused regions 22, the $n^+$ diffused regions 23, the gate oxide films 16, and the gate electrodes 17 are formed in and on the surface of the n semiconductor layer 21 by the process known in the art as shown in FIG. 19.

The insulating layer 18 is formed over the top surface. The insulating layer 18 such as a BPSG film is patterned by the photolithography technique so as to cover the gate oxide films 16 and the gate electrodes 17.

The patterned insulating layers 18 are subjected to heat treatment above a temperature at which the insulating layers 18 are softened in an oxidative ambient containing oxygen or water vapor (oxygen and hydrogen mixed combustion) for several minutes to several hours. The insulating layers 18 are then softened by the heat treatment and cause the reflow phenomenon. The sectional configuration of the insulating layers 18 is rounded, and the insulating layers 18 having the inclined surfaces 26 are completed.

The emitter electrode 42 is formed over the insulating layers 18, the p diffused regions 22 and the $n^+$ diffused regions 23. The collector electrode 43 is formed on the second major surface of the $p^+$ substrate 41. This completes the IGBT of the second preferred embodiment. The steps of forming the electrodes 42 and 43 need not necessarily be the final steps.

Relatively good covering property of the emitter electrode 42 is held if the smooth inclined surfaces 26 formed in the insulating layers 18 by the heat treatment satisfies $Y/X \leq 5$, similar to the first preferred embodiment, where X is the length of the inclined surface 26 in the direction of the surface of the n semiconductor layer 21 and Y is the height of the inclined surface 26 from the surface of the n semiconductor layer 21. Further, very good covering property of the emitter electrode 42 is held if $Y/X \leq 2$ is satisfied (first characteristic).

Consequently, the first characteristic permits the emitter electrode 42 to be formed with the good covering property over the insulating layers 18 which are a stepped ground pattern on the n semiconductor layer 21, providing the non-defective IGBT without the influence of the ground pattern upon the emitter electrode 42.

The good covering property of the electrode wiring layer is held with a relatively high level of integration if the conditional expression $(W/H) \leq 8$ is satisfied where H is the height of the insulating layers 18 from the surface of the n semiconductor layer 21 and W is the spacing between the gate electrodes 17 (second characteristic).

<<Third Preferred Embodiment>>

Figure 23:
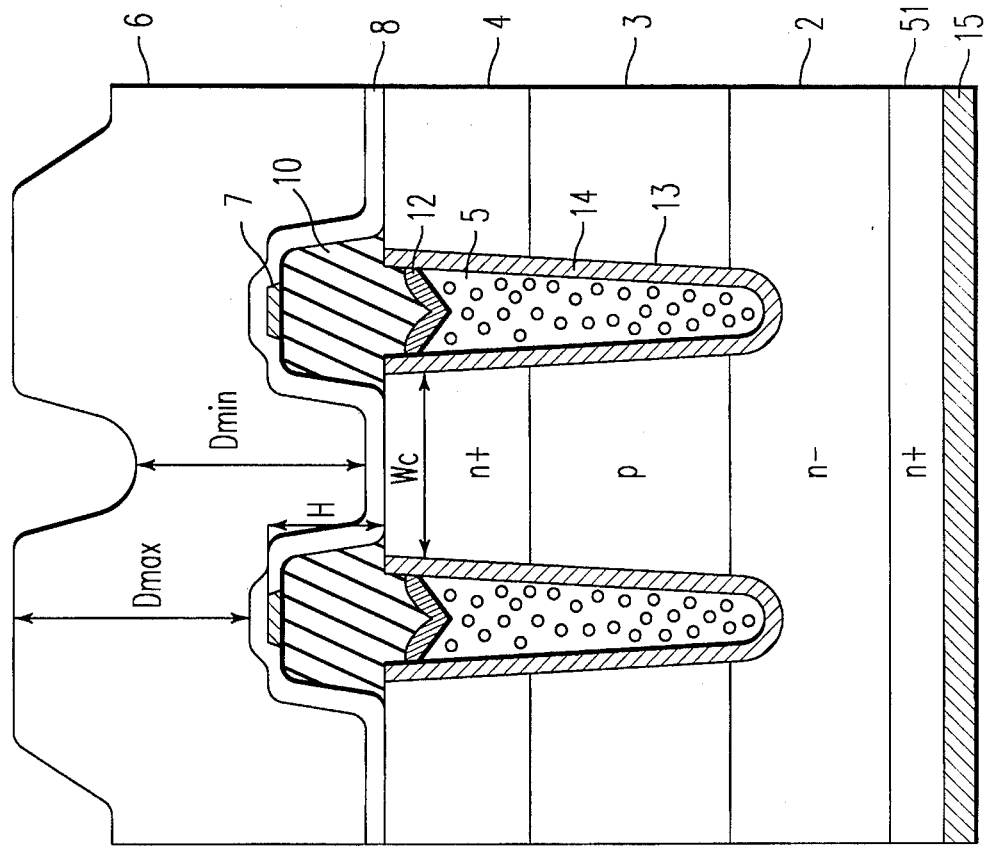
FIG. 23 is a cross-sectional view of a trench gate type MOSFET according to a third preferred embodiment of the present invention.
Figure 22:
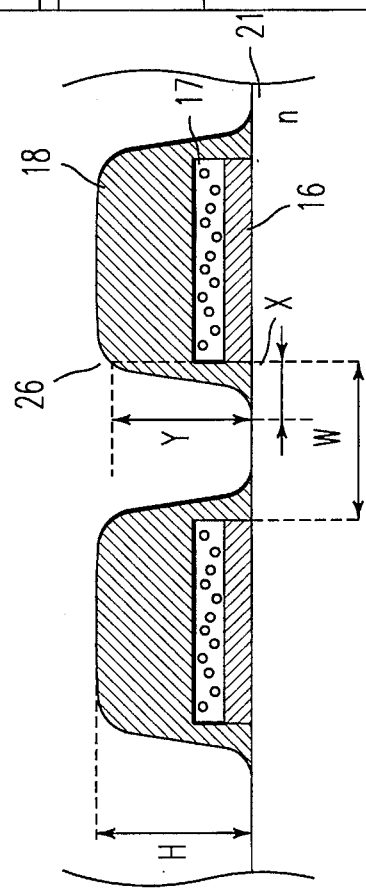
FIG. 22 is a cross-sectional view showing the surface arrangement of the IGBT of the second preferred embodiment.

The first preferred embodiment illustrates the trench gate type IGBT employing the p-type substrate 1 as a power semiconductor device. Referring to FIG. 23, a trench gate type MOSFET using trenches as a gate is formed such that it is similar in construction to the first preferred embodiment except an n-type substrate 51, providing effects similar to those of the first preferred embodiment.

<<Fourth Preferred Embodiment>>

Referring to FIG. 24, an MCT (MOS controlled thyristor) of a trench gate structure provides effects similar to those of the first preferred embodiment. In FIG. 24, the reference character 1A designates a $p^+$ semiconductor substrate of an anode short structure partially including an $n^+$ region, and 19 designates $p^+$ diffused regions formed in an upper portion of the $n^+$ semiconductor layer 4 adjacent the trenches 13. Other constructions of the fourth preferred embodiment are similar to those of the IGBT of the first preferred embodiment.

<<Others>>

Although an Al alloy is used as the electrode wiring layer 6 serving as the emitter electrode in the IGBT of the first preferred embodiment, Al may be used. The BPSG film is used as the cap portions 30 over the trenches 13 for smoothing the stepped portions in the first preferred embodiment. However, a PSG (phosphosilicate glass) film which facilitates the flattening and an oxide film made of TEOS [Si(OC$_2$H$_5$)$_4$] may be used instead.

If the layer insulating layer for forming the cap portions 30 is the PSG film, there is a likelihood that phosphorus in the PSG film will be diffused into the doped polysilicon 5 in the trenches during the heat treatment used for flattening the PSG film in the same manner as the BPSG film. Thus, it is necessary to form the silicon oxide fihns 12 on the surface of the filled doped polysilicon 5 by thermal oxidation or CVD technique, like the first preferred embodiment.

Figure 27:
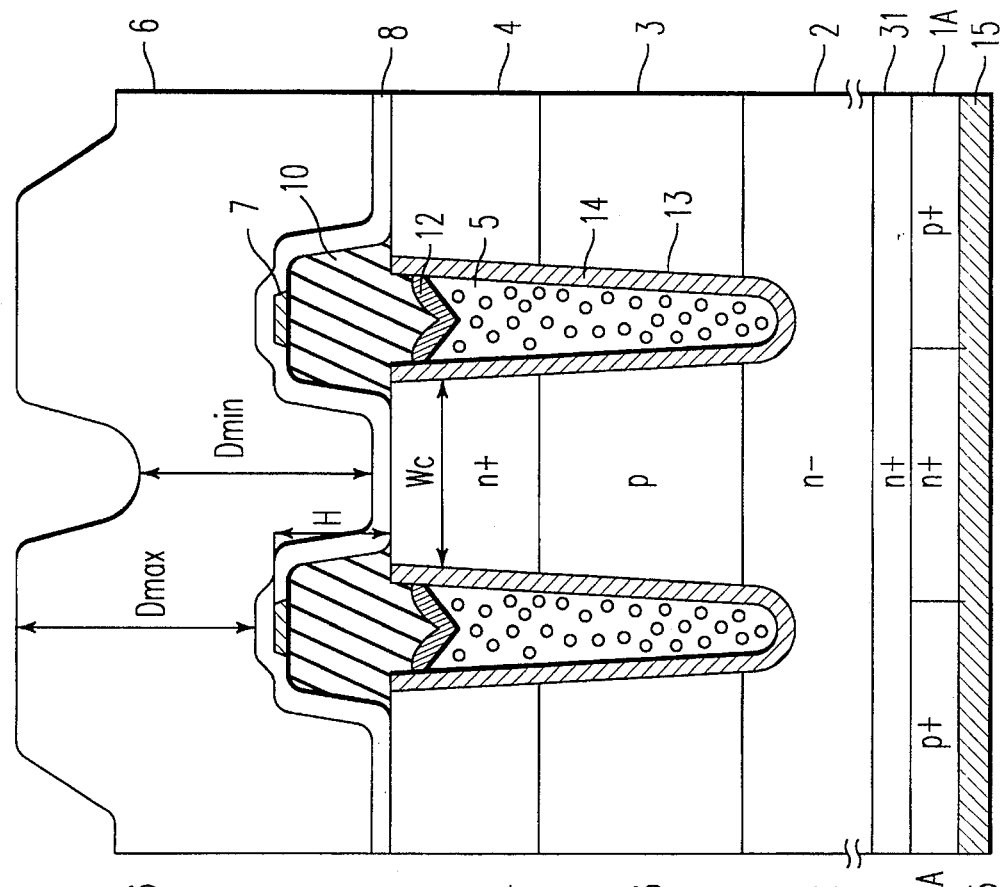
FIG. 27 is a cross-sectional view of a third modification of the IGBT of the first preferred embodiment.
Figure 26:
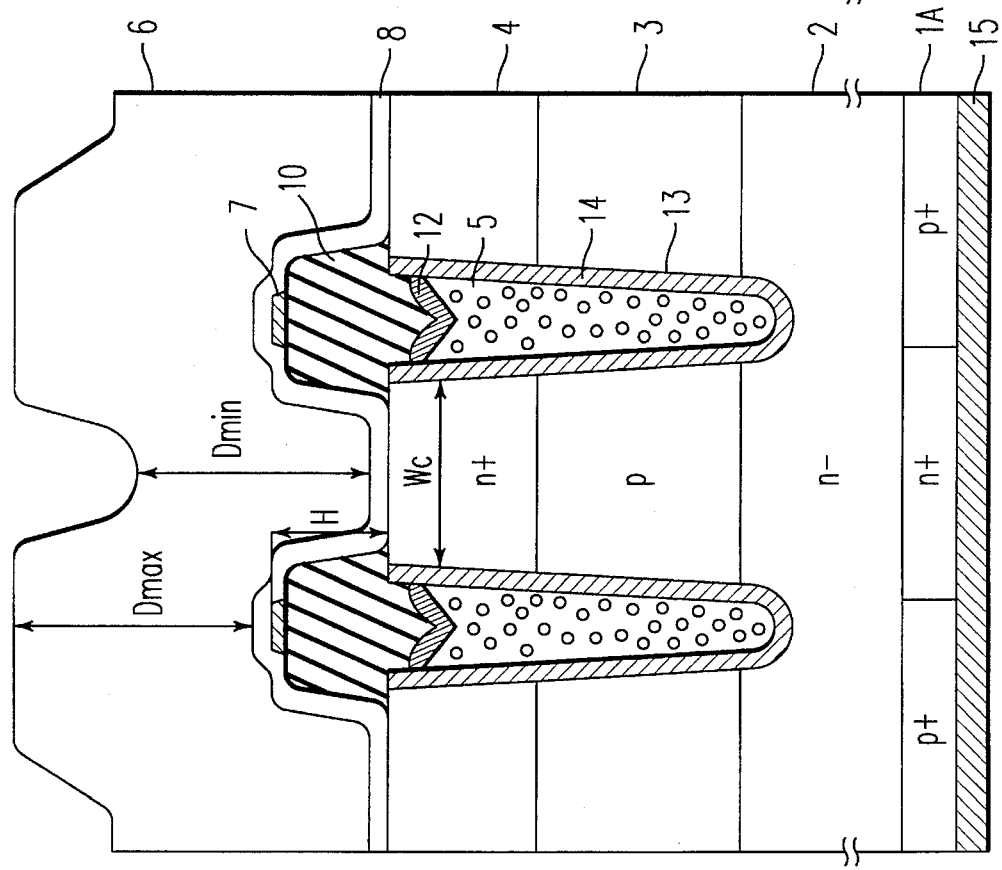
FIG. 26 is a cross-sectional view of a second modification of the IGBT of the first preferred embodiment.
Figure 28:
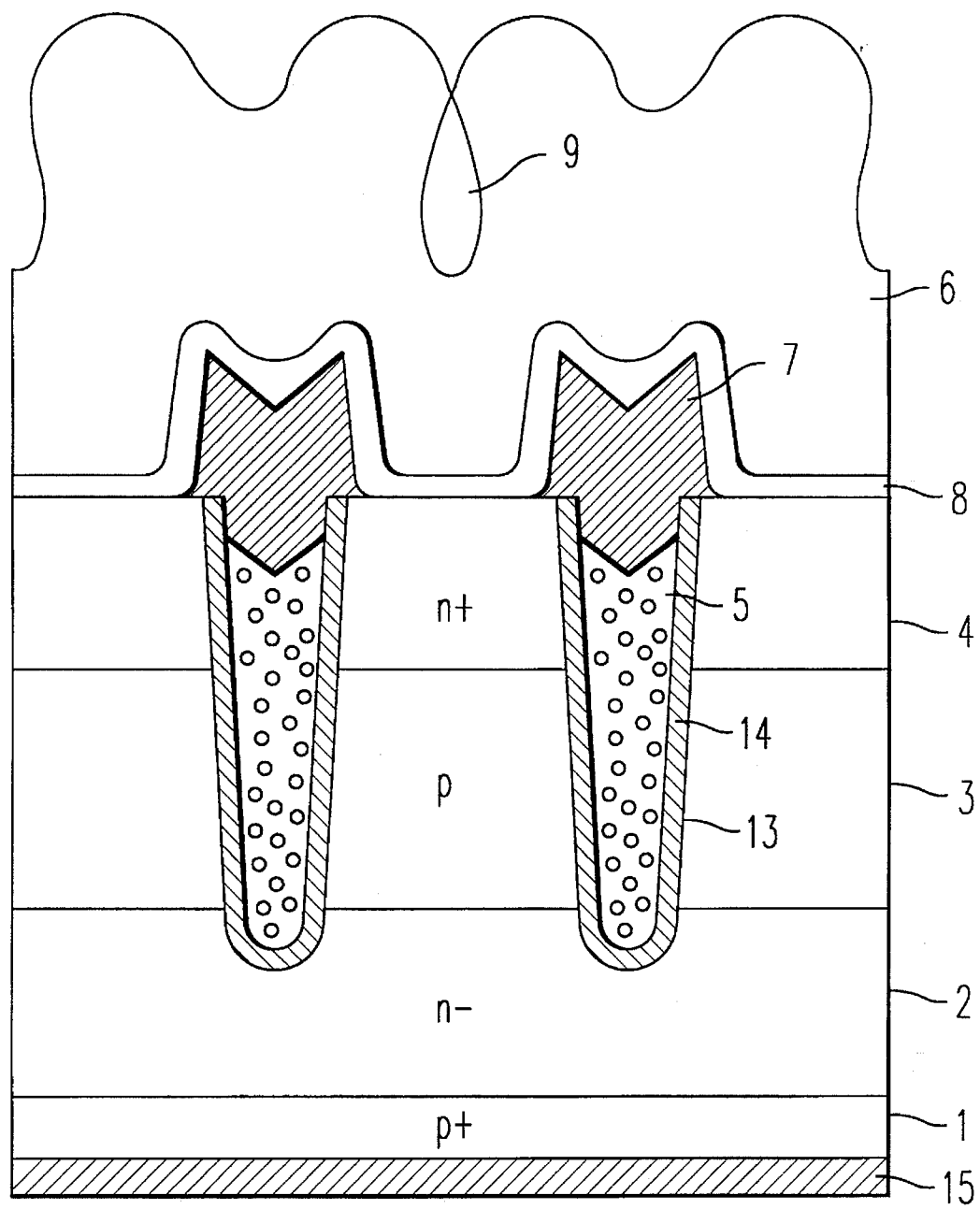
FIG. 28 is a cross-sectional view of a conventional trench gate type IGBT.

Referring to FIG. 25, a first modification of the first preferred embodiment may be constructed such that an n$^+$ buffer layer 31 is formed between the p$^+$ semiconductor substrate 1 and n$^-$ semiconductor layer 2 of the first preferred embodiment of FIG. 1. Referring to FIG. 26, a second modification of the first preferred embodiment may be constructed such that the p$^+$ semiconductor substrate 1 is replaced with the p$^+$ semiconductor substrate 1A of the anode short structure partially including an n$^+$ region. Referring to FIG. 27, a third modification of the first preferred embodiment may be constructed such that the p$^+$ semiconductor substrate 1 is replaced with the p$^+$ semiconductor substrate 1A of the anode short structure partially including an n$^+$ region and the n$^+$ buffer layer 31 is formed between the p$^+$ semiconductor substrate 1A and the n$^-$ semiconductor layer 2. The first to third modifications provide effects similar to those of the IGBT of the first preferred embodiment. Likewise, the first to third modifications may be applied to the IGBT of the surface gate type MOS gate structure of the second preferred embodiment and to the MCT of the fourth preferred embodiment.

In the first, third and fourth preferred embodiments, the trenches 13 have the given width and given depth as shown in FIG. 15. However, the trenches may be of such a hole-like configuration that their depth is greater than their width.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor body having first and second major surfaces;
   a plurality of trench portions each selectively formed in the first major surface of said body to a predetermined depth;
   a plurality of insulating films formed on respective inner walls of said plurality of trench portions;
   a plurality of control electrode layers filled respectively in said plurality of trench portions, with said plurality of insulating films sandwiched between said control electrode layers and the inner walls of said trench portions;
   a plurality of insulating layers formed respectively on said plurality of control electrode layers and projecting from the first major surface of said body;
   a first main electrode formed over the first major surface of said body; and
   a second main electrode formed on the second major surface of said body,
   wherein a control voltage applied commonly to said plurality of control electrode layers controls current between said first and second main electrodes, and
   wherein each of said plurality of insulating layers has an opposite surface, which is opposite the first surface, with rounded edges between an inclined surface, extending from the first major surface, and said opposite surface for preventing cavities from forming in the first main electrode during formation of the semiconductor device, and
   the conditional expression: Y/X≦5 is satisfied where X is a length of said rounded edges in a direction of the first major surface of said body and Y is a height measured between a point where the rounded edges meet the opposite surface and the first major surface of said body.

2. The semiconductor device of claim 1, wherein
   said plurality of trench portions are spaced a predetermined distance apart from each other, and
   the conditional expression: (W/H)≦8 is satisfied where W is said predetermined distance and H is a height of said plurality of insulating layers from the first major surface of said body.

3. The semiconductor device of claim 1, wherein
   said plurality of insulating films are integrally formed,
   said plurality of control electrode layers are integrally formed, and
   said plurality of insulating layers are integrally formed.

4. The semiconductor device of claim 1, wherein
   each of said plurality of insulating layers includes:
   a ground insulating layer formed on each of said control electrode layers; and
   a major insulating layer formed on said ground insulating layer.

5. The semiconductor device of claim 1, wherein
   each of said plurality of insulating layers includes:
   a ground insulating layer formed on each of said control electrode layers;
   a major insulating layer formed on said ground insulating layer; and
   an auxiliary insulating layer formed on said major insulating layer.

6. The semiconductor device of claim 1,
   wherein said body includes:
   a first semiconductor layer having first and second major surfaces;
   a first semiconductor region of a first conductivity type formed on the first major surface of said first semiconductor layer; and
   a second semiconductor region of a second conductivity type formed on said first semiconductor region and having a surface, the second major surface of said first semiconductor layer being the second major surface of said body, the surface of said second semiconductor region being the first major surface of said body, and
   wherein said plurality of trench portions are selectively formed so as to extend from the surface of said second semiconductor region through said second and first semiconductor regions.

7. The semiconductor device of claim 6, wherein
   said first semiconductor layer includes:
   a second semiconductor layer of the first conductivity type formed adjacent the second major surface of said first semiconductor layer; and
   a third semiconductor layer formed adjacent the first major surface of said first semiconductor layer, said third semiconductor layer being intrinsic or of the second conductivity type.

8. The semiconductor device of claim 7,
wherein said third semiconductor layer includes:
a fourth semiconductor layer of the second conductivity type formed on said second semiconductor layer; and
a fifth semiconductor layer of the second conductivity type formed on said fourth semiconductor layer, said fourth semiconductor layer having an impurity concentration higher than that of said fifth semiconductor layer.

9. The semiconductor device of claim 7,
wherein said second semiconductor layer partially includes a third semiconductor region of the second conductivity type extending from a first major surface of said second semiconductor layer to a second major surface thereof.

10. The semiconductor device of claim 7,
wherein said second semiconductor layer partially includes a third semiconductor region of the second conductivity type extending from a first major surface of said second semiconductor layer to a second major surface thereof, and
wherein said third semiconductor layer includes:
a fourth semiconductor layer of the second conductivity type formed on said second semiconductor layer; and
a fifth semiconductor layer of the second conductivity type formed on said fourth semiconductor layer, said fourth semiconductor layer having an impurity concentration higher than that of said fifth semiconductor layer.

11. The semiconductor device of claim 6,
wherein said first semiconductor layer is of the second conductivity type.

12. The semiconductor device of claim 6, further comprising:
a third semiconductor region of the first conductivity type selectively formed in the surface of said second semiconductor region and having a surface, the surfaces of said third and second semiconductor regions being the first major surface of said body.

13. The semiconductor device of claim 12,
wherein said first semiconductor layer includes:
a second semiconductor layer of the first conductivity type formed adjacent the second major surface of said first semiconductor layer; and
a third semiconductor layer formed adjacent the first major surface of said first semiconductor layer, said third semiconductor layer being intrinsic or of the second conductivity type, and
wherein said second semiconductor layer partially includes a fourth semiconductor region of the second conductivity type extending from a first major surface of said second semiconductor layer to a second major surface thereof.

14. A semiconductor device comprising:
a semiconductor body having first and second major surfaces;
a plurality of trench portions each selectively formed from the first major surface of said body to a predetermined depth;
a plurality of insulating films formed over respective inner walls of said plurality of trench portions and part of the first major surface of said body;
a plurality of control electrode layers filled respectively in said plurality of trench portions, with said plurality of insulating films sandwiched between said control electrode layers and the inner walls of said trench portions, and extending over said part of the first major surface of said body, with said plurality of insulating films sandwiched between said control electrode layers and said body;
a plurality of insulating layers formed respectively on said plurality of control electrode layers in said plurality of trench portions and projecting from the first major surface of said body;
a first main electrode formed over the first major surface of said body; and
a second main electrode formed on the second major surface of said body,
wherein a control voltage applied commonly to said plurality of control electrode layers controls current between said first and second main electrodes, and
wherein
the conditional expression: $H2 \geq H1$ is satisfied where $H1$ is a height of said plurality of control electrode layers formed over said part of the first major surface of said body from the first major surface of said body and $H2$ is a height of said plurality of insulating layers over said plurality of trench portions from the first major surface of said body.

15. The semiconductor device of claim 14, wherein
said plurality of trench portions are spaced a predetermined distance apart from each other, and
the conditional expression: $(W/H2) \leq 8$ is satisfied where $W$ is said predetermined distance.

16. The semiconductor device of claim 14, wherein
said plurality of insulating films are integrally formed,
said plurality of control electrode layers are integrally formed, and
said plurality of insulating layers are integrally formed.

17. The semiconductor device of claim 14, wherein
each of said plurality of insulating layers includes:
a ground insulating layer formed on each of said control electrode layers; and
a major insulating layer formed on said ground insulating layer.

18. The semiconductor device of claim 14, wherein, each of said plurality of insulating layers, includes:
a ground insulating layer formed on each of said control electrode layers;
a major insulating layer formed on said ground insulating layer.

19. The semiconductor device of claim 18, wherein
said plurality of insulating films are integrally formed,
said plurality of control electrode layers are integrally formed, and
said plurality of insulating layers are integrally formed.

20. The semiconductor device of claim 18, wherein
said plurality of trench portions are spaced a predetermined distance apart from each other, and
the conditional expression: $(W/H2) \leq 8$ is satisfied where $W$ is said predetermined distance.

21. A semiconductor device comprising:
a semiconductor body having first and second major surfaces;
a plurality of trench portions each selectively formed from the first major surface of said body to a predetermined depth;
a plurality of insulating films formed over respective inner walls of said plurality of trench portions and part of the first major surface of said body;

a plurality of control electrode layers filled respectively in said plurality of trench portions, with said plurality of insulating films sandwiched between said control electrode layers and the inner walls of said trench portions, and extending over said part of the first major surface of said body, with said plurality of insulating films sandwiched between said control electrode layers and said body;

a plurality of insulating layers formed respectively on said plurality of control electrode layers in said plurality of trench portions and projecting from the first major surface of said body;

a first main electrode formed over the first major surface of said body; and a second main electrode formed on the second major surface of said body, wherein a control voltage applied commonly to said plurality of control electrode layers controls current between said first and second main electrodes, and wherein each of said plurality of insulating layers over said plurality of trench portions has a smooth inclined surface from top to bottom, and the conditional expression: $H2 \geq H1$ and the conditional expression: $Y/X \leq 5$ are both satisfied where X is a length of said inclined surface in a direction of the first major surface of said body, Y is a height of said inclined surface from the first major surface of said body, Y is a height of said plurality of control electrode layers formed over said part of the first major surface of said body from the first major surface of said body, and H2 is a height of said plurality of insulating layers over said plurality of trench portions from the first major surface of said body.

22. The semiconductor device of claim 21, wherein each of said plurality of insulating layers includes:
  a ground insulating layer formed on each of said control electrode layers; and
  a major insulating layer formed on said ground insulating layer.

23. The semiconductor device of claim 21, wherein each of said plurality of insulating layers includes:
  a ground insulating layer formed on each of said control electrode layers;
  a major insulating layer formed on said ground insulating layer; and
  an auxiliary insulating layer formed on said major insulating layer.

24. A semiconductor device comprising:

a body having first and second major surfaces and including an upper layer portion adjacent the first major surface and a lower layer portion adjacent the second major surface, at least said upper layer portion being made of a semiconductor of a first conductivity type;

a plurality of first semiconductor regions of a second conductivity type selectively formed in said upper layer portion of said body;

a plurality of second semiconductor regions of the first conductivity type selectively formed in respective surfaces of said plurality of first semiconductor regions;

a plurality of insulating films each formed on one of said first semiconductor regions between said upper layer portion of said body and said second semiconductor regions;

a plurality of control electrodes formed respectively on said plurality of insulating films;

a plurality of insulating layers for covering said plurality of insulating films and said plurality of control electrodes, respectively;

a first main electrode formed over the first major surface of said body; and a second main electrode formed on the second major surface of said body, wherein a control voltage applied commonly to said plurality of control electrodes controls current between said first and second main electrodes, and wherein each of said plurality of insulating layers has an opposite surface, which is opposite the first surface, with rounded edges between an inclined surface, extending from the first major surface, and said opposite surface for preventing cavities from forming in the first main electrode during formation of the semiconductor device, and the conditional expression: $Y/X \leq 5$ is satisfied where X is a length of said rounded edges in a direction of the first major surface of said body and Y is a height measured between a point where the rounded edges meet the opposite surface and the first major surface of said body;

wherein said plurality of control electrodes are spaced a predetermined distance apart from each other, and the conditional expression $(W/H) \leq 8$ is satisfied where W is said predetermined distance and H is a heiqht of said plurality of insulating layers from the first major surface of said body.

25. The semiconductor device of claim 24,
wherein said lower layer portion of said body is of the second conductivity type.

* * * * *

UNITED STATES PATENT AND TRADEMARK OFFICE
CERTIFICATE OF CORRECTION

PATENT NO. : 5,508,534
DATED : April 16, 1996
INVENTOR(S) : Katsumi NAKAMURA et al.

It is certified that error appears in the above-indentified patent and that said Letters Patent is hereby corrected as shown below:

On the title page, Item [75], the third inventor's last name is written incorrectly. It should read:

--Shuuichi Tominaga--

Signed and Sealed this

Twenty-sixth Day of November 1996

Attest:

BRUCE LEHMAN

Attesting Officer            Commissioner of Patents and Trademarks